United States Patent [19]

Tsuda et al.

[11] 4,336,569

[45] Jun. 22, 1982

[54] CONTROL PANEL ASSEMBLY

[75] Inventors: Tatsuya Tsuda; Yoshikatsu Ohno, both of Osaka, Japan

[73] Assignee: Sharp Kabushiki Kaisha, Osaka, Japan

[21] Appl. No.: 51,393

[22] Filed: Jun. 25, 1979

[30] Foreign Application Priority Data

Jun. 26, 1978 [JP] Japan .................................. 53-77680

[51] Int. Cl.3 .......................... H05B 6/66; H05K 1/14

[52] U.S. Cl. ............................. 361/395; 219/10.55 R; 219/10.55 B; 361/399

[58] Field of Search .................. 219/10.55 B, 10.55 R; 361/401, 397, 399, 395, 358; 200/292, DIG. 1

[56] References Cited

U.S. PATENT DOCUMENTS

| | | | |
|---|---|---|---|
| 3,631,299 | 12/1971 | Meyer et al. | 361/399 |
| 3,971,127 | 7/1976 | Giguere et al. | 361/398 X |
| 4,056,699 | 11/1977 | Jordan | 219/10.55 B |
| 4,092,698 | 5/1978 | Brefka | 361/399 |
| 4,133,995 | 1/1979 | Buck | 219/10.55 B |
| 4,149,217 | 3/1979 | Tucker | 361/358 |

*Primary Examiner*—Arthur T. Grimley
*Attorney, Agent, or Firm*—Birch, Stewart, Kolasch and Birch

[57] ABSTRACT

A control panel assembly adapted for controlling operation of a cooking utensil comprises a control panel, a printed wiring board forming a back surface of the control panel assembly, and circuit elements including a semiconductor chip device arranged on the printed wiring board. Virtually all the bodies of the circuit elements are mounted on a first surface of the printed wiring board. The first surface is opposite to a heating source for the cooking utensil. Virtually all electric connectors for the circuit elements are supported on a second surface of the printed wiring board, the second surface facing the heating source. With such a construction, the second surface including the electric connectors, namely, the back surface of the control panel assembly is substantially flat and non-rugged.

5 Claims, 7 Drawing Figures

CONTROL PANEL ASSEMBLY

BACKGROUND OF THE INVENTION

The present invention relates to a configuration of a cooking utensil and, more particularly, to a cooling system of a cooking utensil such as a microwave oven.

Recently, control systems for microwave ovens have been developed and disclosed in U.S. Pat. No. 4,011,428 granted to Robert D. Fosnough et al, for example. In these control systems, at least one semiconductor chip is generally incorporated for operation. Such a semiconductor chip may be easily damaged by heat evolved from a heating source within the housing for the cooking utensil. Heat problems would damage the semiconductor chip and would disrupt the cooking operation of the cooking utensil.

OBJECTS AND SUMMARY OF THE INVENTION

Accordingly, it is a primary object of the present invention to provide a novel cooling system of a cooking utensil such as a microwave oven.

It is a further object of the present invention to provide a novel cooling system of a cooking utensil by the provision of a printed wiring board on which the entire semiconductor chip device is installed the body of the semiconductor chip device being positioned opposite from a heating source.

It is a further object of the present invention to provide a novel assembly of a printed wiring board on which a semiconductor chip device is arranged, the printed wiring board being incorporated into a control panel assembly, which is operated for controlling the operation of a cooking utensil.

It is yet a further object of the present invention to provide a novel cooling system with an air duct formed by a printed wiring board carrying a semiconductor chip device including external terminals such that the body of the chip is placed on the opposite side relative to a heat generator.

It is still another object of the present invention to provide an improved assembly of a printed wiring board adapted for use in a control panel, where test operations for electrical parts including a semiconductor chip device supported on the printed wiring board can be easily carried out.

Other objects and further scope of applicability of the present invention will become apparent from the detailed description given hereinafter. It should be understood, however, that the detailed description and specific examples provide an illustration only, since various changes and modifications within the spirit and scope of the invention will become apparent to those skilled in the art from this detailed description.

To obtain the above objectives, pursuant to an embodiment of the present invention, a control panel assembly adapted for controlling operation of a cooking utensil comprises a control panel, a printed wiring board forming a back surface of the control panel assembly, and circuit elements including a semiconductor chip arranged on the printed wiring board.

Virtually all of the semiconductor circuit elements are mounted on a first surface of the printed wiring board. The first surface is opposite to a heating source for the cooking utensil. Virtually all of electric connectors for the circuit elements are supported on a second surface of the printed wiring board, the second surface facing the heating source. With such a construction, the second surface including the electrical connectors, namely, the back surface of the control panel assembly is substantially flat and non-rugged.

In this feature of the present invention, the control panel assembly is adapted to be easily examined by connecting the second surface of the printed wiring board on the back surface of the control panel assembly with a test machine.

In another feature of the present invention, there is further formed a space between the control panel and the printed wiring board, and an aspiration window for aspirating extrinsic air therethrough. In accordance with the above described configuration, the introduced air passes through the space between the control panel and the printed wiring board, during which the circuit elements are cooled by air.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE INVENTION

First of all, the present invention can be applied to any cooking utensil, e.g., a microwave oven, and a microwave oven combined with one or more different cooking sources such as an electric heating oven, a gas oven or the like. However, this is not concerned with the crux of the present invention since a cooking utensil includes at least one heat source.

For convenience of the description, the cooking utensil is explained in terms of a microwave oven.

Figure 1:
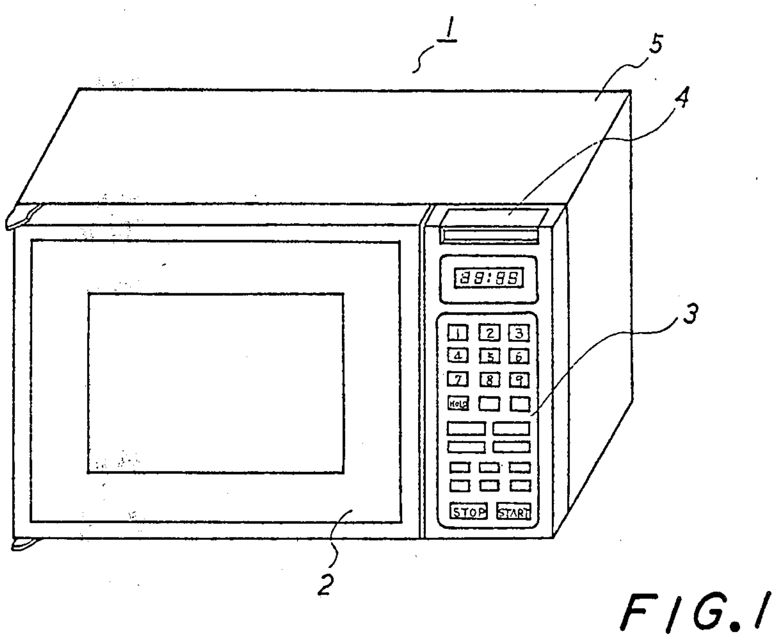
FIG. 1 is a perspective view of a microwave oven according to the present invention.

FIG. 1 shows a microwave oven 1 of the present invention in a perspective view. The microwave oven 1 comprises an oven door 2, a control unit 3, a door open lever 4, and a housing 5.

The control unit 3 contains a plurality of key switches and a display. The plurality of key switches are operated to load a desired cooking program to be executed by the microwave oven 1. The display indicates horological time information, a cooking temperature up to which a foodstuff is heated, a cooking time period during which the foodstuff is cooked, and the like. The functions of the key switches and the display are disclosed in, for example, Fosnough et al, U.S. Pat. No.

4,011,428, the disclosure of which is incorporated herein by reference. The door open lever 4 is depressed to cause the oven door 2 to open.

Figure 2:
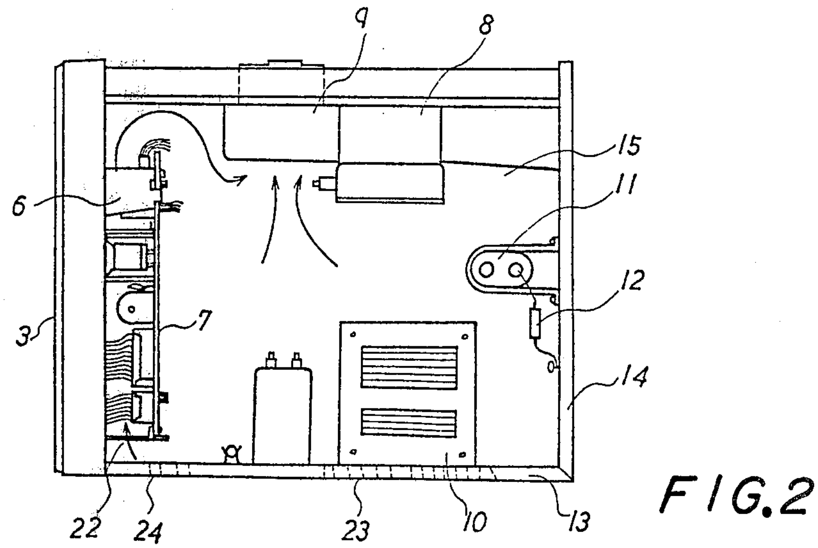
FIG. 2 is a cross-sectional view of the microwave oven shown in FIG. 1 illustrating the interior parts of the oven by omitting the cabinet housing.

FIG. 2 illustrates the interior and connecting mechanisms involved in the microwave oven 1 by omitting the cabinet housing.

With reference to FIG. 2, the control unit 3 supports a printed wiring board 7 with the aid of a supporting member 6. At the back of the control unit 3, namely, within the housing 5, there are disposed a magnetron 8, a cooling blower 9, a high voltage transformer 10, a high voltage condenser 11, and a high voltage diode 12.

The magnetron 8 is energized to provide microwave energy into an oven compartment of the microwave oven for cooking purposes.

The high voltage transformer 10 supplies the magnetron 8 with a high voltage through the use of a series resonance circuit. The cooling blower 9 causes an air flow for cooling the magnetron 8. The magnetron 8 and the cooling blower 9 are fixed on a right wall 15 of the housing 5.

The high voltage condenser 11 and the high voltage diode 12 are supported on a back wall 14 of the housing 5. Similarly, the high voltage transformer 10 is fixed on a base wall 13 of the housing 5.

Since all of the elements, including a heating source, such as the high voltage transformer 10, are assembled in a compact space, a semiconductor chip device held on the printed wiring board 7 is exposed to heat radiation evolved from the heating source. The semiconductor chip device is provided for effecting controls of the microwave oven 1 according to a cooking program introduced by the use of the key switches on the control unit 3. Therefore, the semiconductor chip device should be protected from the heat radiation, in order to prevent it from being damaged.

Figure 3:
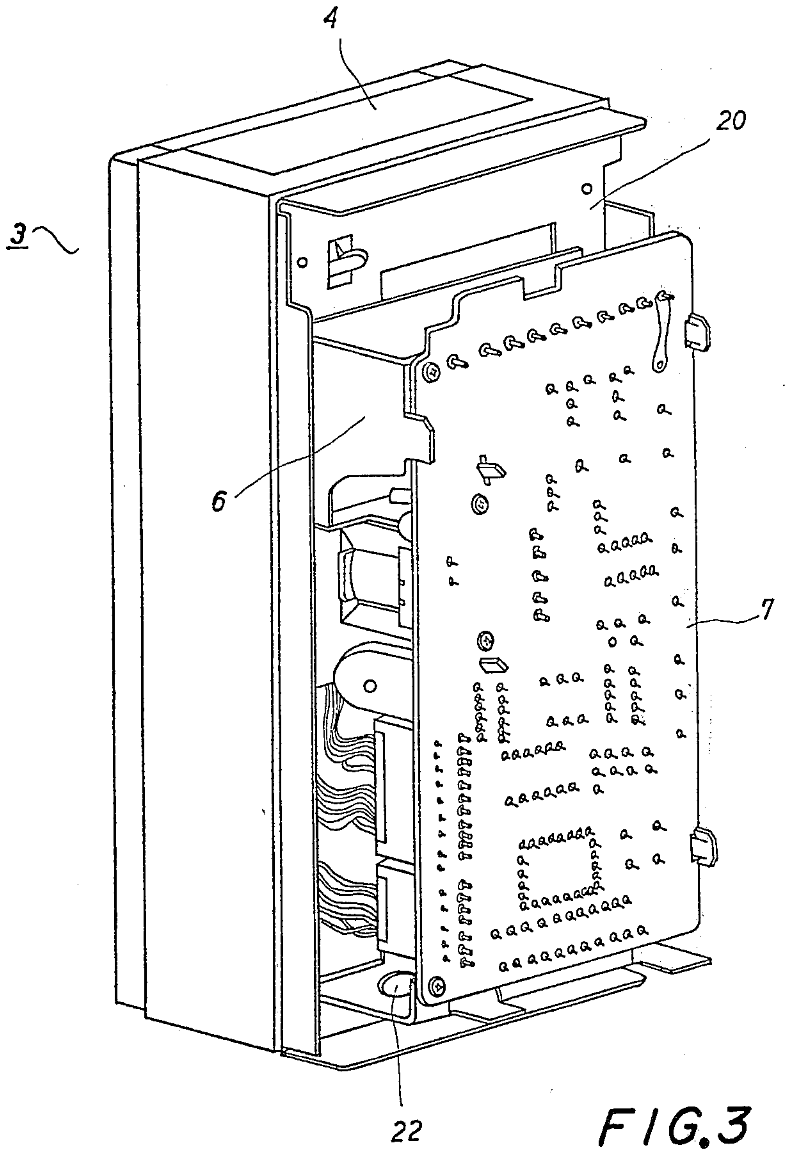
FIG. 3 is a perspective view of a control panel assembly embracing a printed wiring board carrying a semiconductor chip device and various electrical elements according to the present invention.
Figure 4:
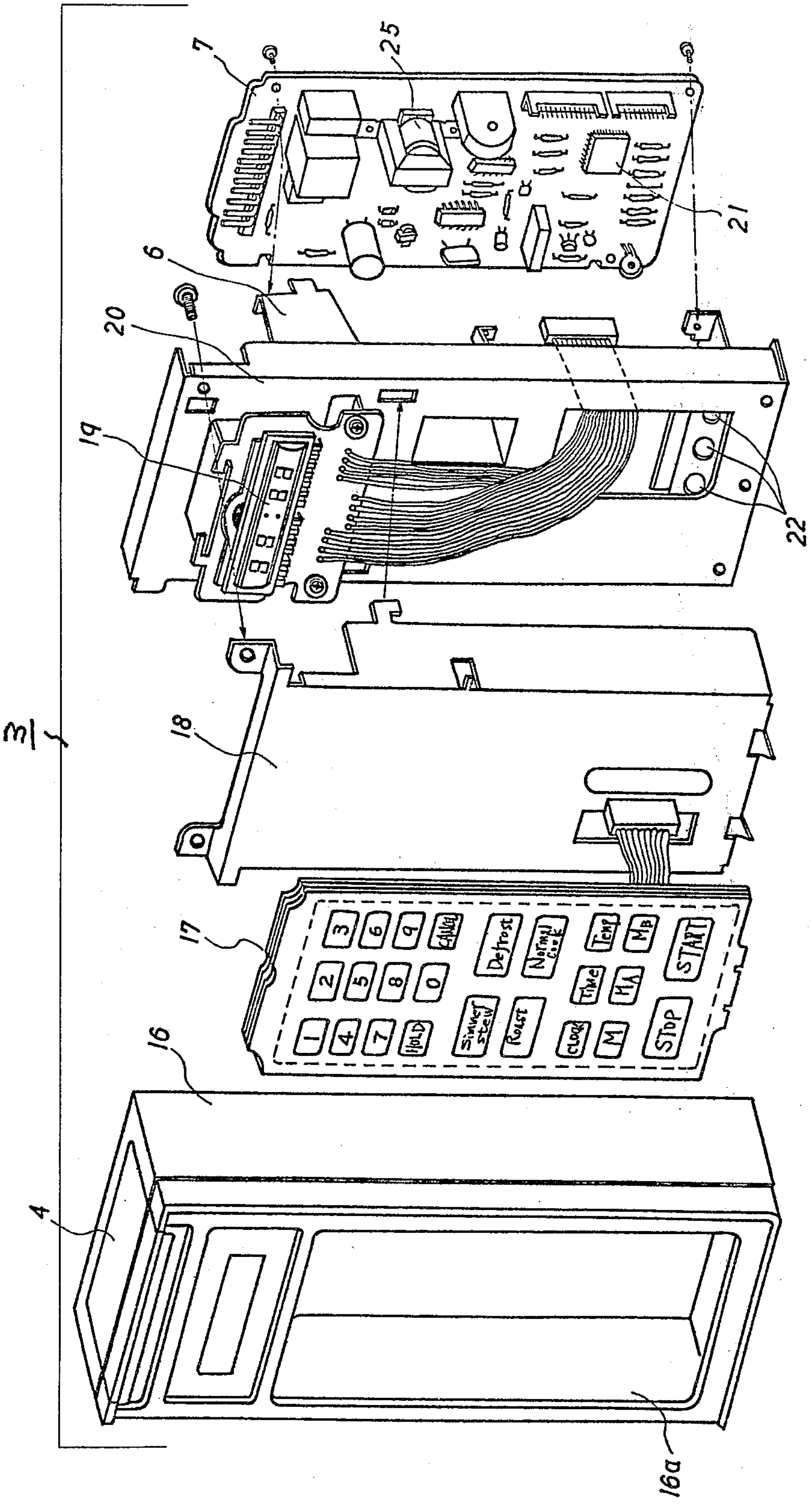
FIG. 4 is an extensive view of the control panel assembly shown in FIG. 3.

FIG. 3 shows the assembly of the present control unit 3 in more detailed perspective view. FIG. 4 is an extensive view of the control unit 3 shown in FIG. 3.

With reference to FIGS. 3 and 4, the control unit 3 is constructed by a panel casing 16 functioning as the housing, a keyboard panel 17 containing the plurality of key switches, a fixing plate 18, a supporting plate 20 including the supporting member 6, and the printed wiring board 7.

The fixing plate 18 allows the keyboard panel 17 to be accurately arranged in registry with an open 16*a* of the panel casing 16. A display 19 is disposed on the supporting plate 20. The supporting member 6 functions to fix the printed wiring board 7 as mentioned above. The printed wiring board 7 carries a plurality of circuit elements including a semiconductor chip device 21. Almost all of the circuit elements are arranged so that they are directed opposite to the heating source. Therefore, they are not directly exposed to the heat radiation developed from the heating source. The fixing plate 18, the supporting plate 20, and the printed wire board 7 are combined by means of screws as shown in FIG. 3. Desired electrical patterns are formed on the board 7 for electrical communication between the circuit elements in this way.

With reference to FIG. 4, there are formed a plurality of openings 22 in the supporting plate 20. In FIG. 4, three such openings are shown. As shown in FIG. 2, two sets of aspiration windows 23 and 24 are formed in the base wall 13.

When the cooling blower 9 is operated, it aspirates extrinsic air through the aspiration windows 23 and 24. A part of the extrinsic air flows into a space between the supporting plate 20 and the printed wiring board 7 through the openings 22 of the supporting plate 20 as indicated by a line with an arrow head of FIG. 2. The part of the air functions to cool the circuit elements supported on the printed wiring board 7.

The remaining portions of the introduced extrinsic air is sent to the heating source such as the high voltage transformer 10, and thereafter to the magnetron 8 for cooling these elements. The aspirated air is then expired through an expiration window (not shown) and so on.

In another feature of the present invention, the present control unit assembly can be easily checked as to its working condition in the aggregate as shown in FIG. 3. The overall assembly of the control unit 3 illustrated in FIG. 3 can be easily carried and subjected to examination. The electrical check of the control unit 3 is carried out in the assembling procedure for the microwave oven 1. The semiconductor chip device 21 per se can be examined in manufacturing and the assembly of the control unit 3 should be now checked.

The check of the control unit assembly is performed such that check terminals of the printed wiring board 7 are connected to a test machine. All of the check terminals can be directly engaged with the test machine at once because the back surface of the printed wiring board 7 does not have any projection such as an extending circuit element, rather, it is substantially flat.

As illustrated in FIG. 3, a plurality of combinations between soldering members and terminals of the circuit elements are simply arranged on the back surface of the printed wiring board 7. These combinations do not prevent the control unit 3 including the printed wiring board 7 from being examined.

Needless to say, the printed wiring board 7 per se, before being combined with the control unit 3, can be easily checked because of the flatness of the back surface.

Therefore, a speedy examination of the printed wiring board 7 per se and the control unit 3 incorporating the printed wiring board 7 can be achieved thanks to the substantial flatness of the back surface of the board 7, in other words, the back of the control unit 3.

Figure 5:
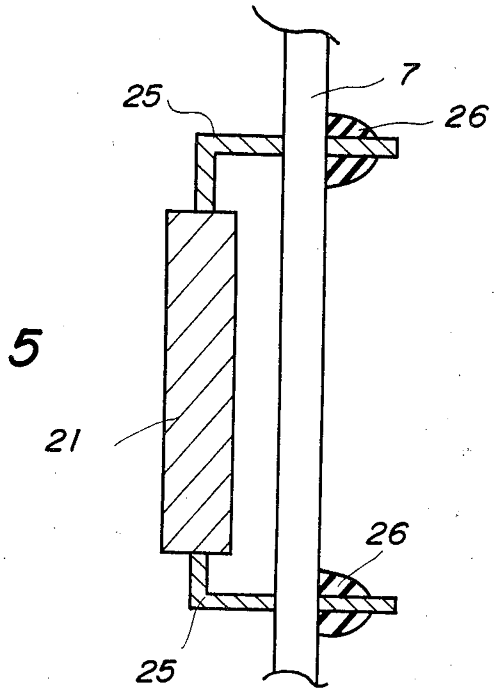
FIG. 5 is a sectional view of a semiconductor chip device arranged on the printed wiring board shown in FIGS. 3 and 4.

FIG. 5 denotes a sectional view of the semiconductor chip device 21 supported on the printed wiring board 7 as shown in FIG. 4. The semiconductor chip device 21 has a plurality of external terminals 25 which are all bent. The respective terminals 25 are adhered with an electrical pattern on the printed wiring board 7 with the aid of soldering members 26. The body of the semiconductor chip device 21 is separated from the heating source, say, the high voltage transformer 10 by the printed wiring board 7. The back surface of the board 7 on which the soldering members 26 are disposed is placed face to face with the high voltage transformer 10.

Figure 6A:
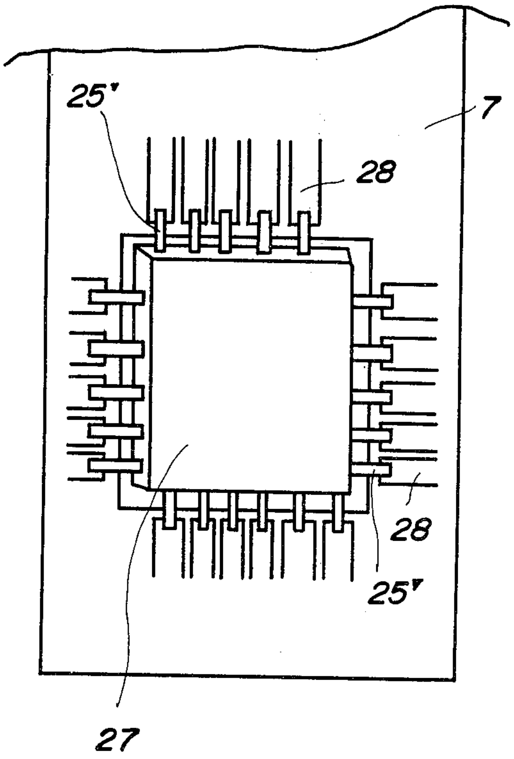
FIG. 6A is a perspective view of another type of a semiconductor chip device held on the printed wiring board similar to FIGS. 3 and 4.
Figure 6B:
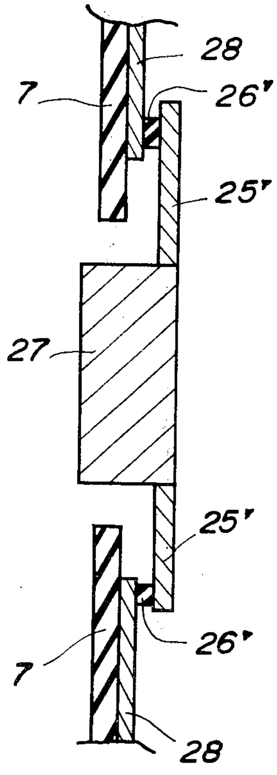
FIG. 6B is a sectional view of the semiconductor chip device shown in FIG. 6A.

FIG. 6A shows another type of a semiconductor chip 27 held on the printed wiring board 7. FIG. 6B indicates a sectional view of the semiconductor chip device 27 of FIG. 6A. A group of terminals 25' of the semiconductor chip device 27 extend straightforwardly. Soldering members 26' are utilized for connecting the terminals 25 with an electrical pattern 28 formed on the printed wiring board 7, thereby supporting the device 27. The surface carrying the electrical pattern 28 faces the high voltage transformer 10 while the body of the semiconductor chip device 27 excluding the terminals 25' extend toward the direction opposed to the transformer 10.

Therefore, the back surface of the printed wiring board 7 is substantially flat in the same manner as the control unit 3 shown in FIG. 3. It is also apparent that the circuit elements are held on the printed wiring board 7 similarly to that shown in FIG. 4. The speedy examination of the printed wiring board 7 per se and the control unit 3 incorporating the board 7 can also be expected.

While only certain embodiments of the present invention have been described, it will be apparent to those skilled in the art that various changes and modifications may be made therein without departing from the spirit and scope of the invention as claimed.

What is claimed is:

1. A control unit for controlling the operation of a cooking utensil, comprising:

a panel forming a front surface of the control unit and having a control means disposed thereon for introducing control instructions into said cooking utensil;

a printed wiring board forming a back surface of the control unit, said printed wiring board including circuit elements and a semiconductor chip device arranged thereon, said circuit elements and said semiconductor chip device being mounted on a first surface of the printed wiring board, the first surface facing the interior portion of the control unit; and electrical connectors connecting the circuit elements and the semiconductor chip device together, said electrical connectors being supported on a second surface of the printed wiring board, the second surface being an opposite surface relative to the first surface and being an exterior surface of said control unit on the back surface thereof, the second surface being substantially flat.

2. The control unit according to claim 1, further comprising test terminal connected to the electrical connectors on the second surface of the printed wiring board.

3. The control unit according to claim 1, wherein the semiconductor chip device comprises a body and terminals connected thereto, the body of the semiconductor chip device being mounted on the first surface of the printed wiring board, the terminals of the semiconductor chip device penetrating the printed wiring board and extending therethrough to the second surface thereof.

4. The control unit according to claim 1, wherein the semiconductor chip device includes a body and terminals connected thereto, and wherein the printed wiring board includes an opening disposed therethrough for accommodating the body of the semiconductor chip device, the body being disposed adjacent the first surface of the printed wiring board, and the terminals of the semiconductor chip device being adhered to the electrical connectors formed on the second surface of the printed wiring board.

5. The control unit according to claim 3 or 4, wherein the panel is spaced a certain distance from the printed wiring board, forming a space therebetween whereby an air flow passes through the space for cooling the body of said semiconductor chip device.

* * * * *